United States Patent [19]

Stepan et al.

[11] Patent Number: 4,518,211

[45] Date of Patent: May 21, 1985

[54] DEVICE FOR MOUNTING, INTERCONNECTING AND TERMINATING PRINTED CIRCUITS

[75] Inventors: William E. Stepan, Clarendon Hills; Wayne E. Neese, Hoffman Estates; Thomas D. Belanger, Jr., Hinsdale; Robert F. Janninck, Elmhurst, all of Ill.

[73] Assignee: GTE Automatic Electric Inc., Northlake, Ill.

[21] Appl. No.: 536,073

[22] Filed: Sep. 26, 1983

[51] Int. Cl.³ ............................................. H01R 23/68
[52] U.S. Cl. ............................................... 339/17 LM
[58] Field of Search .......... 339/17 L, 17 LM, 17 LC, 339/17 M; 361/395, 399, 412, 415

[56] References Cited

U.S. PATENT DOCUMENTS

| | | | |
|---|---|---|---|
| 2,754,453 | 7/1956 | Noell | 339/17 LM |
| 2,777,893 | 1/1957 | DeRosso | 361/399 |
| 3,141,998 | 7/1964 | Silkman | 361/395 |
| 3,147,402 | 9/1964 | Hochstetler | 339/17 LM |
| 3,177,404 | 4/1965 | Patmore | 361/415 |
| 4,094,568 | 6/1978 | Lee et al. | 339/17 LM |

OTHER PUBLICATIONS

IBM Bulletin, Guttridge et al., vol. 20, No. 6, pp. 2162–2163, 11–1977.

Primary Examiner—Neil Abrams
Attorney, Agent, or Firm—Anthony Miologos; Peter Xiarhos

[57] ABSTRACT

A device is disclosed for mounting, interconnecting and terminating printed circuits. The invention comprises a frame of insulating material including a fixed printed circuit substrate and an area for supporting and confining a removable printed circuit substrate. A connector molded on one end of the frame extends input/output signals to both substrates. A handle molded on a second end of the frame includes slots through which clips are inserted electrically interconnecting the two substrates. The clips also aid in retaining the removable circuit substrate to the frame.

4 Claims, 4 Drawing Figures

DEVICE FOR MOUNTING, INTERCONNECTING AND TERMINATING PRINTED CIRCUITS

CROSS REFERENCE TO RELATED APPLICATIONS

The present application is related to copending U.S. patent application Ser. No. 536,074, entitled "Printed Circuit Connecting Device", having the same inventive entity and being assigned to the same assignee.

BACKGROUND OF THE INVENTION

This invention relates in general to devices for mounting electric circuit elements and more particularly to a device for mounting, interconnecting and terminating thick/thin film substrates and/or printed wiring cards.

Electronic systems are now commonly made up from a variety of individual elements some of which are separate components and many of which are complete circuits or sub-circuits. For example, in card form, that is, in the form of a printed circuit card having circuit components, such as resistors, capacitors and transistors.

In order to obtain high packaging density of electronic circuits, specialized or hybrid circuit techniques are used, which involves the depositing of various electrical and resistive pastes in a pattern on a dielectric substrate surface. Leadless circuit packages and other circuit devices may also be soldered to the conductive paste on the substrate forming a complete circuit.

In order to obtain very high packaging density of such circuits, it is advantageous to utilize two or more smaller printed circuit substrates rather than one large one. Such circuit partitioning, however, may result in increased costs for interconnecting hardware due to the preponderance and number of circuit connecting leads and the labor involved in assembling more piece parts. Therefore, it becomes the object of the present invention to provide a device for mounting interconnecting and terminating partitioned printed circuits.

SUMMARY OF THE INVENTION

In accomplishing the objects of the present invention a device is disclosed for mounting, interconnecting and terminating printed circuits. The device comprises a frame of insulating material including first and second major sides and first and second minor sides. A fixed component mounting surface is integrally joined to the frame between the first and second major sides and the first and second minor sides. The fixed component mounting surface may be prepared in any conventional way to receive printed circuits thereon, i.e., either thin film, thick film or conventional circuit traces.

An inner face of the first major side and second major side includes mounting means arranged to accept a removable component mounting surface, also having printed circuits affixed thereon.

The first minor side is configured as an input/output connector and includes a first plurality of terminal means each including a terminal connector engaging portion on the outer face of the first minor side and a contact portion extending from an opposite face. Each contact portion is arranged to communicate with an associated conductive trace on the fixed component mounting surface. A second plurality of terminating means each including a terminal connector engaging portion and contact portion further extend input and output signals to the printed circuits of the removable component mounting surface.

The second minor side includes a plurality of openings extending through the second minor side. The openings are arranged to accept interconnection means, comprising U-shaped electrically conductive members. When each member is properly installed a first leg contacts a conductive trace on the fixed component mounting surface and the second leg contacts a conductive trace on the removable component mounting surface. In this manner electrical signals between the two printed circuits are interconnected. The U-shaped members also provide along with the second plurality of contact portions a means of retaining the removable component mounting surface to the frame.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
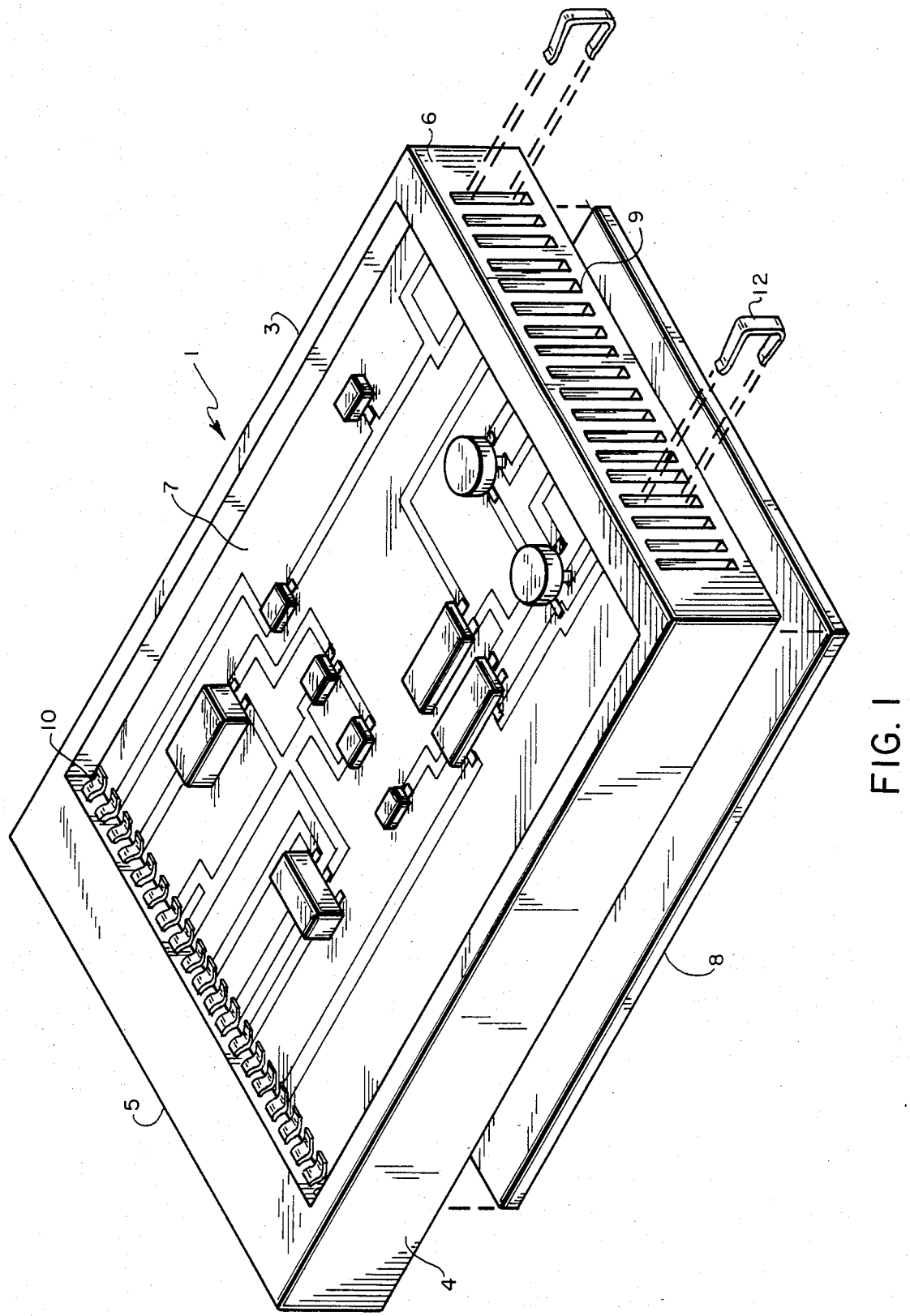
FIG. 1 is a perspective view of the device according to the invention.

Referring to FIG. 1 of the drawings, the device according to the invention comprises a frame 1 of insulating material advantageously of rectangular shape. The frame 1 is characterized by major sides 3 and 4, a fixed component mounting surface 7 and minor sides 5 and 6. The fixed component mounting surface 7 is integrally molded to the frame between the major and minor sides and is intended to be used with any circuit preparation process which produces a planar circuit, i.e., thick or thin film circuits. The frame 1 is also capable of accepting a removable component mounting surface 8 on the underside of the fixed mounting surface 7 between the major and the minor sides.

Input/output connections to circuit surfaces 7 and 8 are provided via minor side 5 which is configured as a connector. Minor side 5 includes first and second rows of contacts 10 and 11 (second row 11 not shown) arranged to electrically connect mounting surfaces 7 and 8 to external circuitry. Minor side 6 includes a row of openings 9 across the outer surface of the minor side each arranged to accept a U-shaped clip 12 therein. Clips 12 electrically interconnect circuit surfaces 7 and 8 and along with the second row of contacts 11, retain the removable component mounting surface 8 to frame 1.

Figure 4:
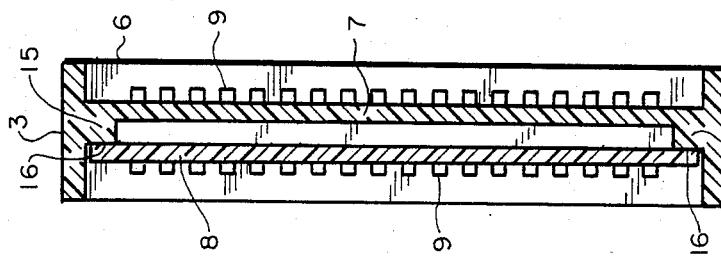
FIG. 4 is a transverse sectional view of the device taken substantially along line BB.
Figure 2:
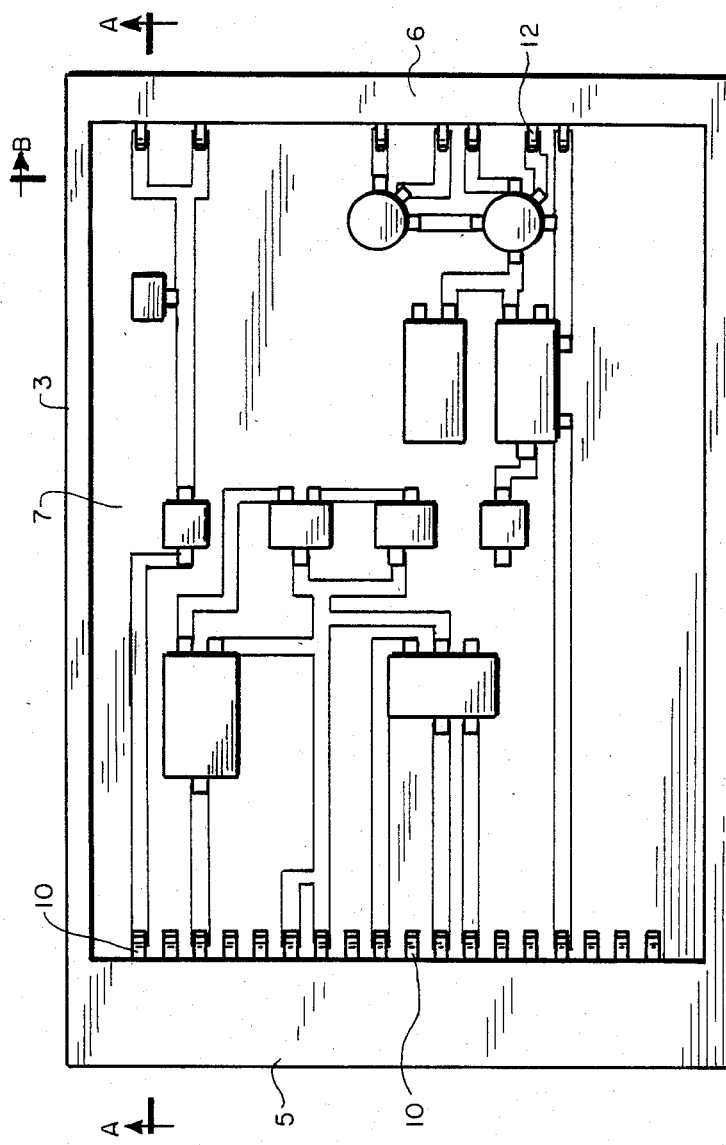
FIG. 2 is a top plan view of the device.
Figure 3:
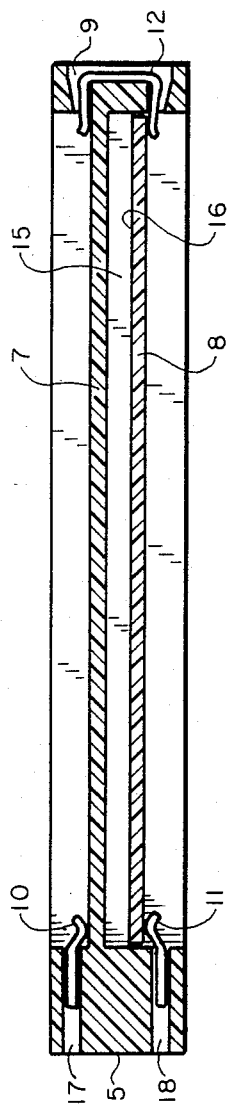
FIG. 3 is a longitudinal sectional view of the device taken substantially along line AA.

Turning now to FIGS. 2, 3 and 4, a more detailed explanation of the structure of frame 1 will be given. As can be more readily seen in FIG. 4, the inner surfaces of major sides 3 and 4 include mounting rails 15 molded to the inner surfaces of major sides 3 and 4. Each mounting rail 15 runs longitudinally along the inner surfaces of each respective major side 3 and 4 and are arranged to accept on a surface 16 the removable component mounting surface 8.

Removable component mounting surface 8 is held in position by the second row of contacts 11 and the action of the U-shaped clips 12 when inserted into openings 9.

Each contact 10 and 11 is fitted into an individual receptacle portion 17 and 18, respectively. Each receptacle has an opening on the outer surface of minor side 5. The spaced parallel rows of receptacles are arranged to accept connector pins within each receptacle 17 and 18 of a mating terminal connector device (not shown). The pins of the terminating connector contact respective contacts 10 and 11 connecting both surfaces 7 and 8 to circuitry exterior of the frame.

As mentioned previously, clips 12 provide electrical interconnection between the two boards and also help retain removable mounting surface 8 to the frame. Only those number of clips 12 are used as required to interconnect the fixed component surface 7 to the removable component surface 8. Minor side 6 also performs the function of a handle allowing the frame to be easily extracted when mounted on an external connector.

Although the best mode contemplated for carrying out the present invention has been herein shown and described, it will be apparent that modifications and variations may be made without departing from what is recorded as the subject matter of the invention.

What is claimed is:

1. A device for mounting, interconnecting and terminating printed circuits comprising:
   a frame of insulating material including first and second major sides and first and second minor sides;
   a fixed component mounting surface integrally joined to said frame between said first and second major sides and said first and second minor sides, said fixed component mounting surface including printed circuits affixed on a face thereof;
   mounting means integrally joined to an inner face of said first major side and said second major side, said mounting means arranged to accept a removable component mounting surface having printed circuits fixed on a face thereof;
   a first plurality of terminal means each including a terminal connector engaging portion on an outer face of said first minor side for connecting to a source of input/output signals and contact portions extending from an opposite face of said first minor side, each of said contact portions communicating with an associated printed circuit of said fixed component mounting surface;
   a second plurality of terminal means each including a terminal connector engaging portion on an outer face of said first minor side for connecting to a source of input/output signals and contact portions extending from an opposite face of said first minor side, each of said contact portions communicating with an associated printed circuit of said removable component mounting surface;
   a plurality of openings extending through said second minor side, said openings arranged to accept a plurality of electrically conductive U-shaped members, each U-shaped member arranged to be accepted within one of said second minor side openings with a first leg of said U-shaped member contacting a printed circuit of said fixed component mounting surface and a second leg contacting a printed circuit of said removable component mounting surface whereby, said U-shaped members electrically connects the printed circuits of said fixed component mounting surface to the printed circuits of said removable component mounting surface and mechanically retains said removable component mounting surface to said frame.

2. The device as claimed in claim 1, wherein: said mounting means comprises a generally rectangular flange longitudinally oriented along an inner face of each said first and second major sides, each flange including a first planar surface having said fixed component mounting surface integrally joined thereat, and each flange futher including a second planar surface directly opposite of said first planar surface arranged to accept and rest thereon said removable component mounting surface.

3. The device as claimed in claim 1, wherein: said first plurality of terminal means comprises a parallel row of equidistantly spaced holes, said holes arranged to accept therein terminal pins of a terminal connector, each of said holes further including an electrical terminal having a terminal pin engaging portion arranged to mate with an associated terminal pin on one end and a contact portion extending out of said first minor side surface on an opposite end, each contact portion engages a printed circuit of said fixed component mounting surface extending input/output signals between said terminal connector and said fixed component mounting surface.

4. The device as claimed in claim 1, wherein: said second plurality of terminal means comprises a parallel row of equidistantly spaced holes, said holes arranged to accept therein terminal pins of a terminal connector, each of said holes further including an electrical terminal having a terminal pin engaging portion on one end arranged to mate with an associated terminal pin and a contact portion extending out of said first minor side inner surface on an opposite end, each contact portion engages a printed circuit of said removable component mounting surface extending input/output signals between said terminal connector and said removable component mounting surface.

* * * * *